United States Patent [19]

Shoji

[11] Patent Number: 4,710,650
[45] Date of Patent: Dec. 1, 1987

[54] DUAL DOMINO CMOS LOGIC CIRCUIT, INCLUDING COMPLEMENTARY VECTORIZATION AND INTEGRATION

[75] Inventor: Masakazu Shoji, Warren, N.J.

[73] Assignee: American Telephone and Telegraph Company, AT&T Bell Laboratories, Murray Hill, N.J.

[21] Appl. No.: 900,579

[22] Filed: Aug. 26, 1986

[51] Int. Cl.$^4$ ............... H03K 19/003; H03K 19/096
[52] U.S. Cl. ................. 307/452; 307/443; 307/451; 307/471; 307/481; 307/269
[58] Field of Search ............. 307/443, 448, 451–453, 307/471, 480, 481, 353, 246, 577, 579, 584, 585, 269

[56] References Cited

U.S. PATENT DOCUMENTS

| | | | |
|---|---|---|---|
| 3,953,743 | 4/1976 | Hollingsworth | 307/448 |
| 4,049,974 | 9/1977 | Boone et al. | 307/471 X |
| 4,367,420 | 1/1983 | Foss et al. | 307/453 |
| 4,575,648 | 3/1986 | Lee | 307/451 X |

OTHER PUBLICATIONS

Cole et al., "Logic Gate", IBM T.D.B., vol. 16, No. 2, Jul. 1973, p. 566.
Ho et al., "Static Shift Register for FET Technology", IBM T.D.B., vol. 13, No. 6, Nov. 1970, pp. 1450–1451.
"Latched Domino CMOS Logic", *IEEE Journal of Solid-State Circuits*, vol. SC-21, No. 4, Aug. 1986, pp. 514–522.

Primary Examiner—Stanley D. Miller
Assistant Examiner—D. R. Hudspeth
Attorney, Agent, or Firm—David I. Caplan

[57] ABSTRACT

At each stage of a domino CMOS logic circuit, the output signal S and its inversion $\overline{S}$ are separately generated in mutually complementary first and second logic networks. These outputs S and $\overline{S}$ are then used as inputs for succeeding domino logic stages. In this way, both S and $\overline{S}$ are guaranteed to be low at the end of the precharging phase as is desired for inputs to all domino logic.

7 Claims, 5 Drawing Figures

DUAL DOMINO CMOS LOGIC CIRCUIT, INCLUDING COMPLEMENTARY VECTORIZATION AND INTEGRATION

TECHNICAL FIELD

This invention relates to electronic data processing systems implemented in semiconductor integrated circuits and, more particularly, to integrated logic circuits that employ complementary MOS (CMOS) technology.

BACKGROUND OF THE INVENTION

In electronic data processing systems, a particularly useful form of semiconductor integrated logic circuit has been the domino CMOS logic circuit. It has been described in some detail in the literature, for example, in a paper authored by R. H. Krambeck, et al., entitled "High-Speed Compact Circuits with CMOS," published in *IEEE Journal of Solid-State Circuits*, Vol. SC-17, pp. 614–619 (1982). Briefly, such a circuit comprises a collection of logic gates at least some of which deliver logic signals as logic input signals to others, the entire circuit being periodically activated by a single clock edge during each period, so that each gate computes its prescribed logic function during an evaluation phase that occurs once per clock period. That is, whenever that single clock edge occurs, the gates all enter an evaluation phase during which each gate computes the correspondingly prescribed function, one gate after another, somewhat analogously to the falling down of one domino after another in a network of dominoes.

More specifically, in a domino CMOS circuit each logic gate includes an array of NMOS pull-down driver transistors that are connected for receiving the gate's logic input signals and that are interconnected for implementing the prescribed logic function to be computed by such gate. Each gate further includes a clocked PMOS pull-up transistor for implementing a precharging of an output node of the gate during a precharge phase of each clock period, the clocked NMOS transistor acting as a power switch for suppressing discharge of the output node during the precharge phase. The clocked PMOS pull-up transistor, the output node, the array of NMOS driver transistors, and the NMOS power switch are serially connected between a high voltage level power line ($V_{DD}$) and a low voltage level power line ($V_{SS}$), typically ground. The output node is connected to the input terminal of a static (unclocked) inverter, and the output terminal of this inverter serves as the output terminal of the gate, i.e., where a voltage corresponding to the prescribed logic function (high vs. low, 1 vs. 0) is developed during the evaluation phase of each period immediately following the precharge phase thereof.

During each precharge phase of the clock, the output node of each gate is precharged high by the on state of the clocked PMOS pull-up transistor which the path from the output node to the low level is kept open by the off state of the clocked NMOS power switch. The precharge phase ends and the evaluation phase begins when the power switch is turned on while the clocked PMOS pull-up transistor is turned off, so that the output node can then discharge (or not) to ground through at least one closed path from the output node to the low level through the array of driver transistors (depending upon the logic values of the logic input signals thereto). A significant feature of the domino CMOS circuit is that it includes a plurality of logic gates, typically as many as 700, each gate implementing a prescribed logic function—with each transition from precharge to evaluation phase being induced by means of a single clock edge (or its complement) applied simultaneously to all clocked transistors in all logic gates of the circuit. Typically, a given domino CMOS gate (except for the first in a sequence of gates) receives as input signals some output signals from other gates in the same circuit, as well as perhaps from other sources.

To prevent spurious temporary input signals during the evaluation phase—i.e., signals which would prematurely discharge (pull-down) the output node, with no hope of subsequent restoration by pull-up during that same evaluation phase—it is important in domino CMOS to assure that in every gate no logic input signal should go from high to low during any evaluation phase—to avoid spurious discharge of the output node. To this end, the static inverter is inserted as a buffer between the output node of each domino gate and the drivers in any succeeding domino gate, i.e., any gate that receives signals from such output node. During any precharge—i.e., when the output node of every gate is momentarily at the high level due to pull-up by the clocked PMOS transistor—the corresponding buffer output at the output terminal of every such domino gate will therefore be low, so that any (NMOS) driver that receives as input the output of a (thus buffered) domino gate will receive a low level input and hence will always be off during the precharge phase. Thus, during each evaluation phase immediately following such precharge, the only transition (if any) that a domino gate output can make during an evaluation phase is from low to high, and never from high to low—the latter of which would spuriously pull-down (discharge) the output node to the low voltage level with no hope of restoration back to the high level during that same evaluation phase as would be desired in response to the input of low voltage level. In other words, a temporary initial (false) low level input which then goes high during an evaluation phase is the only allowed transition during evaluation. (Of course, an input signal which is supposed to be low during evaluation need not make any transition if it is already at the appropriate low voltage level during precharge.) As a result, there cannot be any spurious signals or "glitches" in the circuit.

Thus, all domino logic gates in a given circuit can be and are switched from precharge to evaluation phase—i.e., all pull-up transistors are switched from on to off—by means of same signal clock edge. Moreover, if all drivers in a given domino gate are supplied with properly timed logic signal inputs—that is, all inputs guaranteed to be low during all precharge phases—then the power switch for that gate can be omitted. Note that the output developed at the (buffered) output terminal of any domino gate is automatically a properly timed signal in this sense.

A domino CMOS logic circuit has a desirably small power consumption, since there is never a closed d.c. path from the high ($V_{DD}$) to the low ($V_{SS}$) level power line, and the use of a single clock edge to activate the entire domino circuit provides simple operation and full utilization of the speed of each logic gate.

A serious limitation on the use of domino CMOS in prior art arises from the above-mentioned requirement that the only transitions (if any) that any outputs from a domino CMOS gate that are used as inputs to another domino CMOS gate should experience during any evaluation phase are low to high transitions exclusively. However, in order to implement certain logic functions of two or more logic variables, A,B, ... —such as EXCLUSIVE OR, $XOR(A,B) = A\bar{B} + \bar{A}B$, or EXCLUSIVE NOR, $XNOR(A,B) = AB + \overline{AB}$—both a given logic signal A and its inverse $\bar{A}$ are required as logic signal inputs simultaneously to the same gate. But in domino CMOS all logic input signals must be low at the end of the precharge phase, as discussed above. Therefore, since a given logic signal and its inverse cannot both be low simultaneously, a domino CMOS gate requires special measures for implementing any of those logic functions—like XOR and $XNOR(=AB+\overline{AB})$—which contain any logic variable together with its inverse as input logic variables: if during an evaluation A goes from low to high, then in ordinary logic $\bar{A}$ would have to go from high to low-which is undesirable in domino CMOS. Consequently, logic circuits that are designed to implement such functions have required such special measures as the use of multiple clock edges—a scheme which undesirably complicates the logic circuitry and also suffers from slower operation (due to lost time), or have been designed in the forms of static CMOS gates, which are slower than domino CMOS gates. The resulting slower speed of operation is especially a serious problem in cases of many stages of cascaded gates, as in the case of parity trees, for example.

SUMMARY OF THE INVENTION

A domino CMOS logic circuit, operable on a succession of precharge and evaluation phases, is designed with at least one logic gate arrangement that implements the logic function of both a logic variable A and its inverse $\bar{A}$. This gate arrangement is characterized by first and second domino CMOS logic gates having first and second arrays, respectively, of driver transistors, the first and second arrays being mutually complementary both in terms of interconnect structure and in terms of input logic signals. That is, the transistors in the two arrays are interconnected in series and/or parallel in mutually complementary fashion and are connected to receive mutually complementary sets of logic signal inputs. In other words, the original domino CMOS logic gate is duplicated into two mutually complementary domino CMOS gates or gate portions, which together form a dual domino CMOS gate. Moreover, every such thus dual gate will then itself taken as a whole require first and second sets of input signals that are complementary, thereby necessitating that each of the gates preceding the dual domino gate likewise be duplicated, i.e., each to be in the form of a dual domino gate. In this way, the electrical input signal representing A and the electrical input signal representing $\bar{A}$ will both be low at the end of the precharge phase, but one of these signals will be high while the other will be low (depending upon the logic state of A) soon after the beginning of the evaluation phase—as is desired in domino CMOS logic circuits.

Thus, in accordance with the invention, a logic gate has two portions, one being the complement of the other. Mathematically speaking, the complementary duplicate portion of the gate may be defined as the dual of the other portion, the other portion being the original gate of prior art domino CMOS. The resulting logic output signal, say X, from the original gate portion and its inverse $\bar{X}$ from the dual portion together may be thought of as forming an ordered pair or vector $(X, \bar{X})$.

The combined use of both components X and $\bar{X}$ of a plurality of such vectors as inputs for succeeding dual domino gates—i.e., gates that are themselves duplicated in complementary form—may be thought of as integration of such vectors.

BRIEF DESCRIPTION OF THE DRAWING

This invention together with its features and advantages may be better understood from the following detailed description when read in conjunction with the drawing in which.

DETAILED DESCRIPTION

Figure 1:
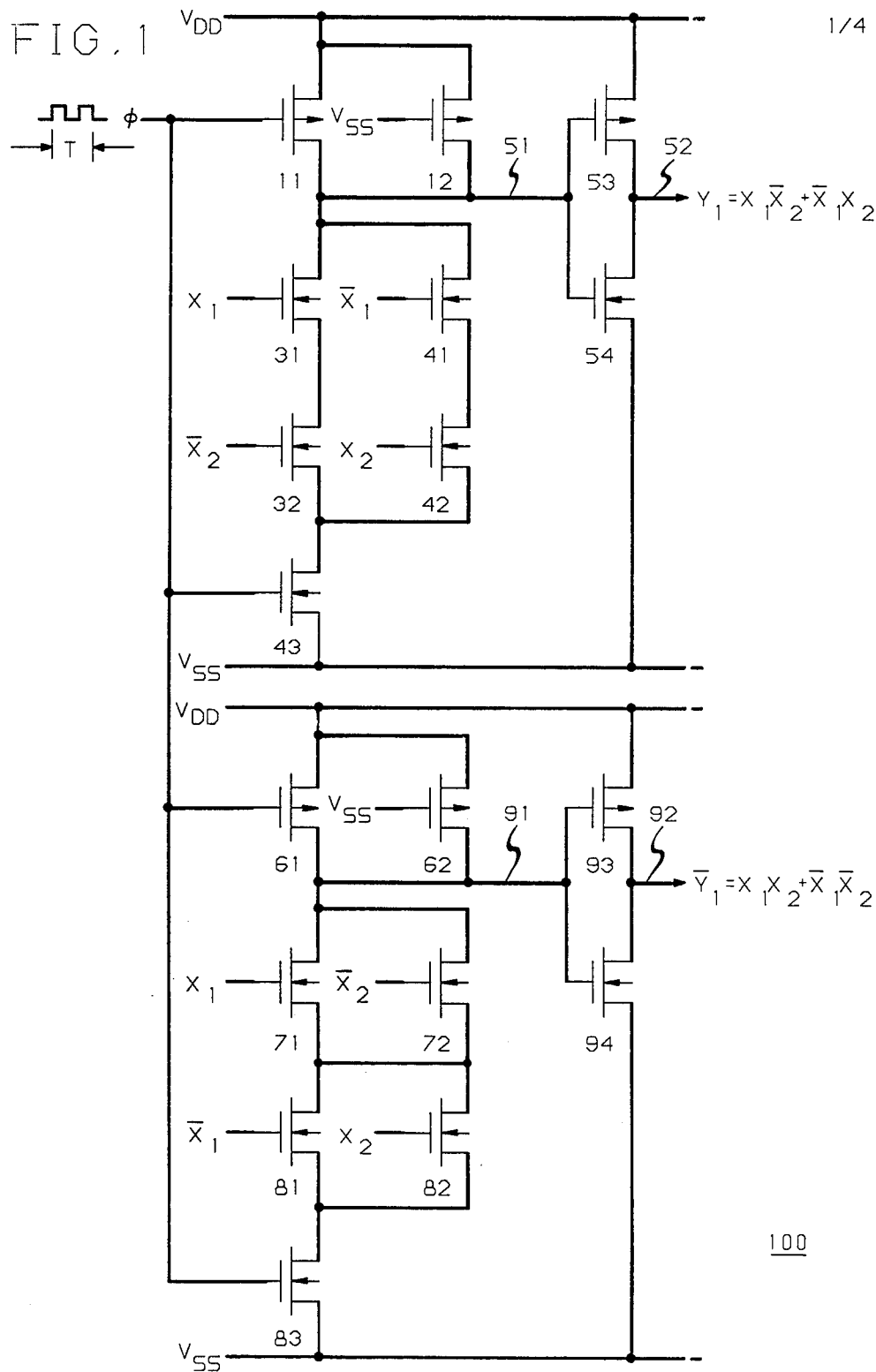
FIG. 1 is a schematic diagram of a dual domino CMOS logic gate, for implementing the dual XOR-XNOR function, in accordance with an illustrative specific embodiment of the invention.
Figure 2:
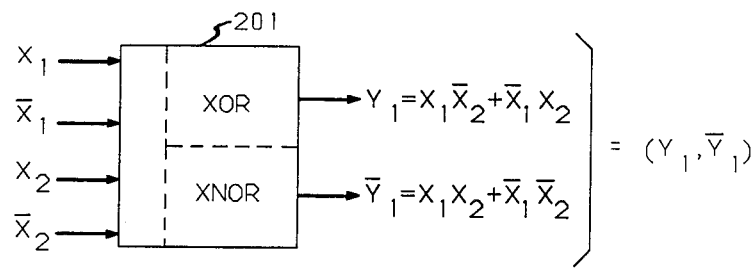
FIG. 2 is a block diagram representing the dual domino logic gate shown in FIG. 1.

FIG. 1 shows a dual domino CMOS logic gate 100 for producing an output in the form of an ordered signal pair $(Y_1, \bar{Y}_1)$ representing the XOR and NXOR functions, respectively, of input variables $X_1$ and $X_2$. This ordered pair $(Y_1, \bar{Y}_1)$ may also be thought of as a vectorized XOR-XNOR output function of $X_1$ and $X_2$, and hence the logic gate 100 itself may be considered and represented as an elementary vectorized XOR-XNOR gate 201 as illustrated in FIG. 2.

More specifically, the logic gate 100 has two main portions, a first (top) portion for generating $Y_1$ and a second (bottom) portion for generating $\bar{Y}_1$, each connected between a high level power line $V_{DD}$ for pull-ups and a low level power line $V_{SS}$ for pull-downs. The first portion develops its output $Y_1$ at its output terminal 52; the second portion develops $\bar{Y}_1$ at its output terminal 92. Although denoted by $Y_1$ and $\bar{Y}_1$, it should be understood that these outputs are not complementary during precharge, when both are low, but they become complementary during evaluation. In the first portion of this dual logic gate 100, pull-up P-channel (PMOS) transistor 11 is clocked by the clock pulse sequence $\phi$ of period T, in order to pull-up the output node 51 during precharge (when $\phi$ is low). Another pull-up PMOS transistor 12 has its gate electrode tied to $V_{SS}$, in order to supply a trickle charge to the output node 51, as known in the art, for the purpose of preventing this node from spuriously drifting low because of charge leakage during evaluation phases (when $\phi$ is high). An array of NMOS driver transistors 31, 32, 41, 42—controlled by logic input signals $X_1, \bar{X}_2, \bar{X}_1, X_2$, respectively—is arranged in series and parallel to implement the logic function $XOR(X_1, X_2) = X_1 \bar{X}_2 + \bar{X}_1 X_2$. These input signals are all subject to the restriction of never going from high to low during evaluation. Another NMOS transistor 43, clocked by $\phi$, serves as a pull-down (or "ground") switch for pulling down the voltage at the output node 51 to the low level $V_{SS}$ if the signals $X_1, X_2, \bar{X}_1, \bar{X}_2$ are such that there is a closed path through the array of driver transistors. Finally, the output node 51 is coupled to the output terminal 52 of the first portion of the logic gate 100 through a (buffering) static inverter formed by PMOS transistor 53 connected in series with NMOS transistor 54.

During operation in the first (top) portion of the dual domino gate 100 throughout each precharge phase ($\phi$ is low) the PMOS transistor 11 is on, while the NMOS transistor 43 is off—so that the output node 51 charges essentially up to the high voltage level $V_{DD}$, while the output terminal 52 discharges essentially to the low voltage level $V_{SS}$, regardless of the on-off states of the drivers 31, 32, 41, 42. On the other hand, when the evaluation phase occurs ($\phi$ is high), the PMOS transistor 11 is off, while the NMOS transistor 43 is on—so that the output node 51 discharges essentially to the low voltage level $V_{SS}$, and hence the output terminal 52 goes high essentially to $V_{DD}$, if and only if a closed path then exists from the output node 51 through the drivers, i.e., if and only if the logic input signals satisfy the logic relation $X_1\overline{X}_2+\overline{X}_1 X_2=1$, that is, $XOR(X_1, X_2)=1$. Thus, the output signal $Y_1$ that is generated during the evaluation phase soon after the inputs $X_1, \overline{X}_1, X_2, \overline{X}_2$ become valid is a faithful representation of the logic function $XOR(X_1, X_2)$ of the inputs. Of course, throughout precharge phases the signal level at the output terminal 52 will always be low regardless of $X_1$ and $X_2$, as is described domino CMOS where $Y_1$ is used as an input in succeeding domino gates.

In the second (bottom) portion of the dual domino gate 100, pull-up transistors 61 and 62 serve the same function with respect to output node 91 as pull-up transistors 11 and 12 with respect to output node 51 in the first (top) portion as described above. Also, pull-down transistor 83 serves the same function (ground switch) as does pull-down transistor 43, and an array of driver transistors 71, 72, 81, 82 is interconnected in an arrangement that is complementary with respect to that of the array transistors 31, 32, 41, 42 in the first (top) portion, that is to say, series and parallel connections being interchanged and logic input signals and their inverses being interchanged. In this way, at the output terminal 92 there is generated during each evaluation phase the output signal $\overline{Y}_1=X_1 X_2+\overline{X}_1 \overline{X}_2$, that is, $\overline{Y}_1=XNOR(X_1, X_2)$, the inverse of $Y_1$ at the output terminal 52 of the first portion of the dual domino logic gate 100.

In order to understand and appreciate the advantages and features of a dual domino logic gate, it is useful to represent the dual domino logic gate 100 as a XOR-XNOR function block, i.e., an XOR-XNOR logic element 201 (FIG. 2) that has inputs $X_1, \overline{X}_1, X_2$, and $\overline{X}_2$, and has the dual outputs $Y_1=X_1\overline{X}_2+\overline{X}_1 X_2=XOR(X_1, X_2)$ and $\overline{Y}_1=X_1 X_2+\overline{X}_1 \overline{X}_2=XNOR(X_1, X_2)$. These dual outputs $Y_1$ and $\overline{Y}_1$, of course, are valid only during the evaluation phases of the clock $\phi$ and are both low logic (logic O) during precharge phases thereof. The representation of these outputs as an ordered pair ($Y_1 \overline{Y}_1$) is useful to idealize the dual output, as a sort of two-dimensional vector, the components ($Y_1$ and $\overline{Y}_1$) of which, however, are not independent. The pair ($Y_1 \overline{Y}_1$) can be visualized, as a vector function of $X_1$ and $X_2$, namely, $(Y_1, \overline{Y}_1)=XOR-XNOR [(X_1, \overline{X}_1),(X_2, \overline{X}_2)]$.

Figure 3:
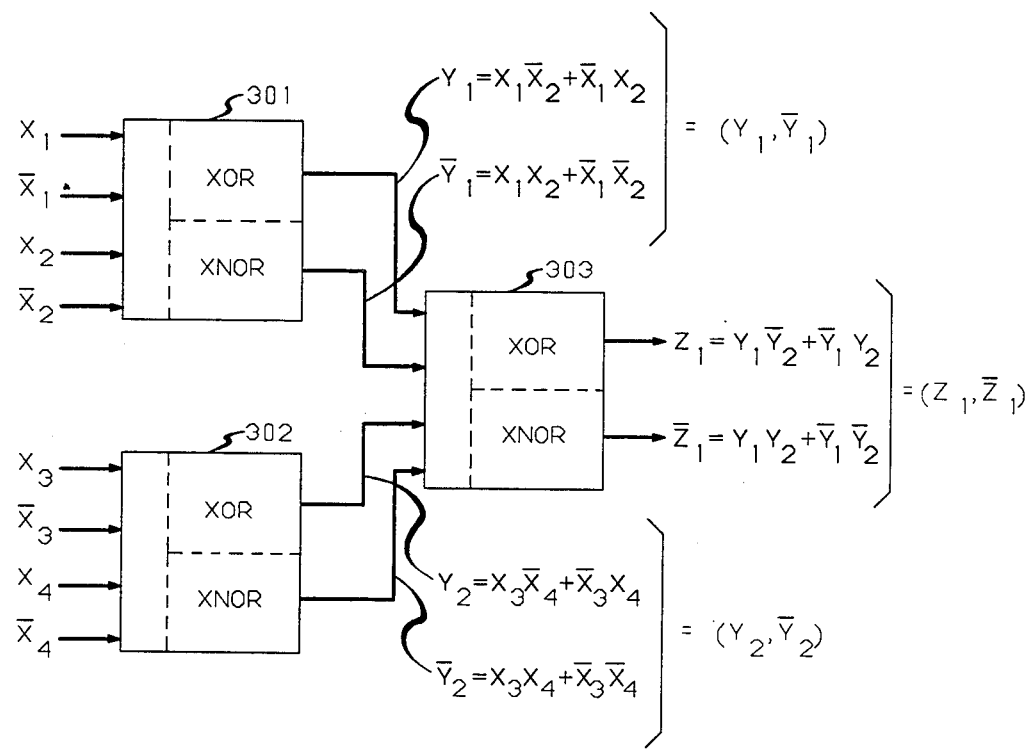
FIG. 3 is a block diagram of two stages of cascaded XOR gates in dual domino CMOS logic, in accordance with another specific embodiment of the invention.

In order to understand the features and advantages of cascaded dual domino logic gates, FIG. 3 shows a first stage composed of two XOr-XNOR dual domino gates 301 and 302 which deliver their outputs ($Y_1, \overline{Y}_1$) and ($Y_2, \overline{Y}_2$) as inputs to a second stage composed of a single XOR-XNOR logic gate 303. The output of this gate 303 is the ordered pair $(Z_1, \overline{Z}_1)=XOR-XNOR [(Y_1, \overline{Y}_1)(Y_2, \overline{Y}_2)]$ or more simple $\{Z_1\}=XOR-XNOR (Y_1, Y_2)$, with the understanding of the symbol $\{X\}$ as the ordered pair $(X, \overline{X})$. It should be understood that the gates 301, 302, and 303 are all operated with the same clock edge supplied by the clock sequence $\phi$. Moreover, FIG. 4 shows in cascade a first stage composed of four XOR-XNOR dual domino gates 401, 402, 403, 404, followed by a second stage composed of two such gates 405 and 406, followed by a single such gate 407.

Figure 4:
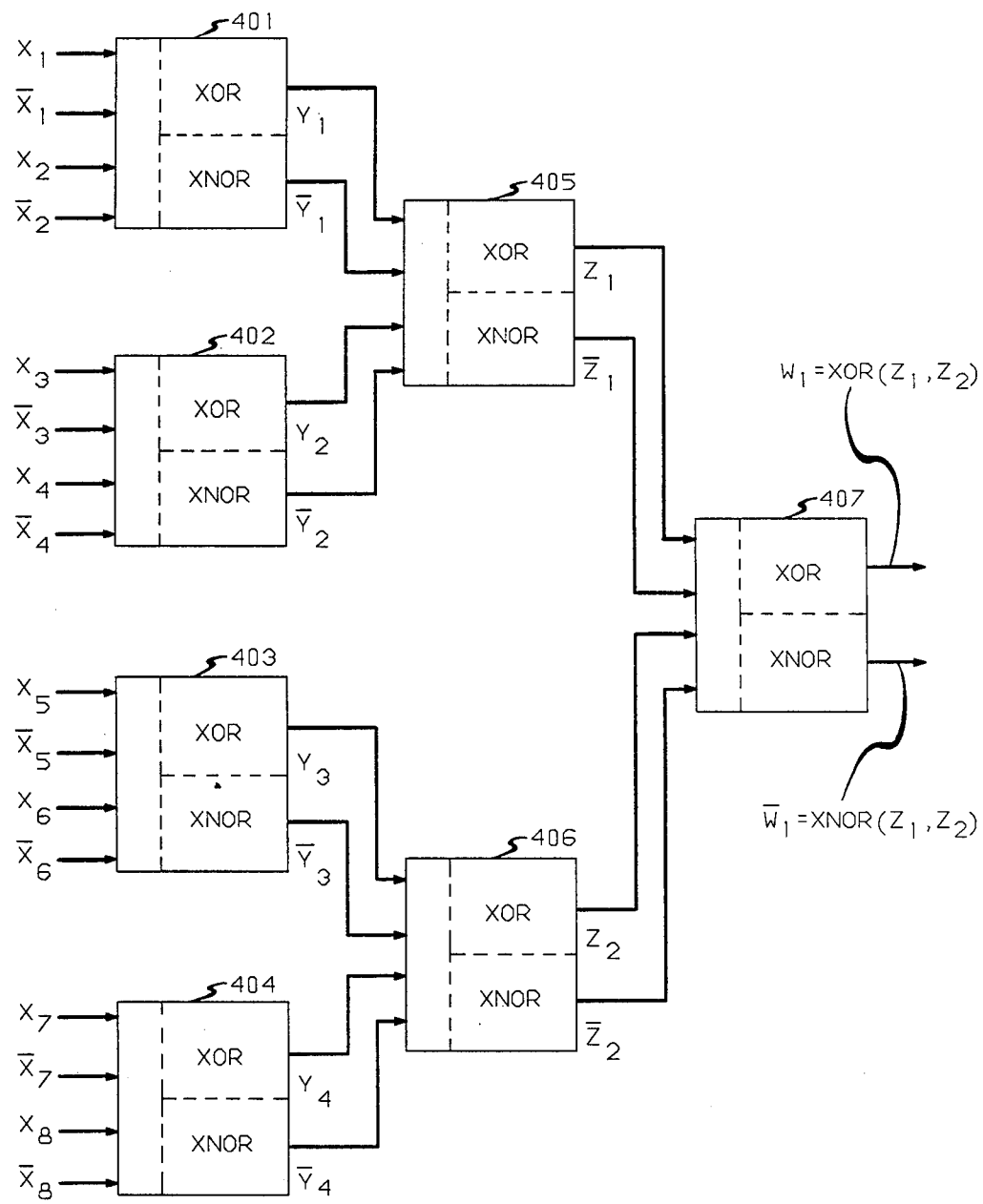
FIG. 4 is a block diagram of those stages of cascaded domino CMOS logic in accordance with yet another specific embodiment of the invention.
Figure 5:
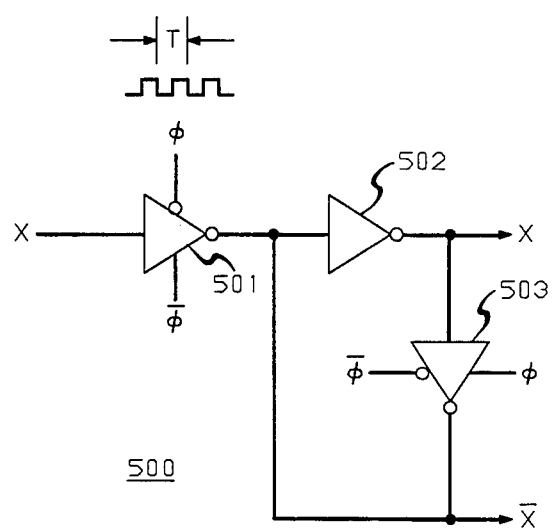
FIG. 5 is a logic diagram of a clocked static latch useful for producing properly timed logic input signals for domino CMOS logic circuits.

While the output signals from every dual domino gate are all low throughout all precharge phases, and thus these outputs are useful as inputs for succeeding domino gates, as shown in FIGS. 3 and 4, the first stage of gates in a cascade chain—as well as certain other gates in other stages in other embodiments of domino CMOS—must receive input signals from elsewhere which may not be guaranteed to be low during precharge phases and thus which may prematurely discharge output nodes during evaluation and thus procedure errors. Therefore, measures must be taken, as illustrated in FIG. 5, to guarantee that an incoming signal, such as $\underline{X}$, is transformed into an equivalent signal X that is delivered as input to domino logic and is a faithful representation of the incoming signal, but it does not go from high to low during evaluation phases of the domino logic. To this end, as shown in FIG. 5, a clocked static latch 500 is used. This latch 500 includes a clocked CMOS inverter 501 that is clocked by the clock pulse sequence $\phi$. As known in the art, the clocked inverter 501 includes a CMOS static inverter (not shown) which receives data from a clocked CMOS transmission gate (not shown), which passes input data X only during the low phases of the clock $\phi$. The latch 500 further includes a static CMOS inverter 502 which is connected to receive the output of the clocked inverter 501. Another clocked CMOS inverter 503 is connected so as to form a feedback loop with the static inverter 502. The clocked inverter 503 is similar in structure to the clocked inverter 501 except that the clocking is such that its transmission gate (not shown) passes data only during the high phases of the clock $\phi$, as indicated by the mutually complementary clocking schemes of the inverters 501 and 503. Thus the output X of the static inverter 502 and $\overline{X}$ of the clocked inverter 503 are both low throughout low phases of $\phi$, i.e., during the precharge phase of the domino CMOS gates (not shown) controlled by the same clock sequence $\phi$, as is desired for inputs to domino CMOS. On the other hand, during evaluation phases one of X and $\overline{X}$ goes high and the other remains low, depending upon the level of the incoming signal $\underline{X}$ at the moment of occurrence of the clock edge when $\phi$ goes from low to high (precharge to evaluation). Thus X and $\overline{X}$ are suitable as inputs for domino CMOS, including dual domino CMOS of this invention, even when the incoming signal $\underline{X}$ itself is not suitable.

What is claimed is:

1. A domino CMOS logic circuit, operable on a succession of precharge and evaluation phases of a clock sequence, including a dual gate having first and second logic gate sections which are logic duals of each other, the first and second sections having first and second mutually complementarily interconnected arrays, respectively, of driver transistors that are respectively connected for receiving mutually complementary first and second sets, respectively, of logic input signals, whereby during each evaluation phase the first and second sections generate first and second outputs, respectively, that are the inverse of each other.

2. The domino circuit recited in claim 1 in which the first and second outputs are the XOR and XNOR functions, respectively, of the first set of logic signals.

3. An integrated circuit including first, second, and third dual gates, each in accordance with claim 1, the first and second gates respectively having first and second output terminals that are separately connected to first and second input terminals, respectively, of the third gate.

4. A circuit including the domino circuit of claim 1.

5. A data processing system including the circuit recited in claim 4.

6. A domino CMOS logic circuit including a dual gate comprising:
(a) mutually complementary first and second logic gate sections, each of which is the logic dual of the other, the first and second sections comprising first and second arrays, respectively, of driver transistors, the driver transistors in the first array being interconnected among themselves in a first interconnect arrangement and the driver transistors in the second array being interconnected among themselves in a second interconnect arrangement that is complementary to the first, the driver transistors in the first array being connected to receive a first set of input logic signals and the driver transistors in the second array being connected to receive a second set of input logic signals that is complementary to the first set;
(b) first and second output nodes respectively, connected to the first and second arrays;
(c) first and second static inverters each having a separate input terminal separately connected to the first and second nodes, respectively, and each having a separate output terminal;
(d) first and second precharge transistors each separately connected to receive a single clock sequence of successive precharge and evaluation phases, separately connected to pull-up the first and second output nodes, respectively.

7. A domino circuit according to claim 6 in which the dual gate further comprises first and second power switches separately connected to the first and second arrays, respectively, for separately pulling down the first and second output nodes during each evaluation phase in accordance with the logic signals.

* * * * *